(12) United States Patent
Wu et al.

(10) Patent No.: US 12,052,823 B2
(45) Date of Patent: Jul. 30, 2024

(54) MAINBOARD CONNECTION STRUCTURE AND GUIDING DEVICE

(71) Applicant: Fulian Precision Electronics (Tianjin) Co., LTD., Tianjin (CN)

(72) Inventors: Chia-Kang Wu, New Taipei (TW); Kun-Yang Cheng, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 214 days.

(21) Appl. No.: 17/864,562

(22) Filed: Jul. 14, 2022

(65) Prior Publication Data

US 2023/0217594 A1 Jul. 6, 2023

(30) Foreign Application Priority Data

Jan. 6, 2022 (CN) .......................... 202210009153.7

(51) Int. Cl.
*H05K 1/14* (2006.01)

(52) U.S. Cl.
CPC ..... *H05K 1/14* (2013.01); *H05K 2201/09063* (2013.01); *H05K 2201/10227* (2013.01); *H05K 2201/2027* (2013.01)

(58) Field of Classification Search
CPC ........... H05K 1/14; H05K 2201/09063; H05K 2201/10227; H05K 2201/2027

USPC .......................................................... 361/784
See application file for complete search history.

(56) References Cited

U.S. PATENT DOCUMENTS

| | | | |
|---|---|---|---|
| 2015/0239517 A1* | 8/2015 | Shirai | ........................ B62J 1/08 403/104 |
| 2019/0127999 A1* | 5/2019 | Puchner | .............. E04G 21/3223 |

FOREIGN PATENT DOCUMENTS

KR 1020080050808 A 6/2008

\* cited by examiner

*Primary Examiner* — Andargie M Aychillhum
(74) *Attorney, Agent, or Firm* — ScienBiziP, P.C.

(57) ABSTRACT

A guiding device includes a first telescopic member, a second telescopic member, and an elastic member. The first telescopic member includes a main body with a sliding cavity. The second telescopic member includes a connecting portion and a guiding portion connected to the connecting portion. The guiding portion is slidably inserted into the sliding cavity. Opposite ends of the elastic member are respectively connected to the connecting portion and the main body. The elastic member pushes the main body in a direction away from the connecting portion. The disclosure also provides a mainboard connection structure having the above guiding device.

20 Claims, 8 Drawing Sheets

MAINBOARD CONNECTION STRUCTURE AND GUIDING DEVICE

FIELD

The subject matter herein generally relates to a guiding device and a mainboard connection structure having the guiding device.

BACKGROUND

At present, in the operation of inserting two mainboards (PCA board) into each other, because it is impossible to accurately align the mainboards, the guiding pin structure is usually used to assist. That is, one mainboard is provided with a guiding pin, and the other mainboard is provided with a guiding hole, and the guiding pin is inserted into the guiding hole to align the mainboards. However, the guiding pin often affects the installation of the housing because the length of the guiding pin is too long, or the guiding pin cannot be used because the length of the guiding pin is too short.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
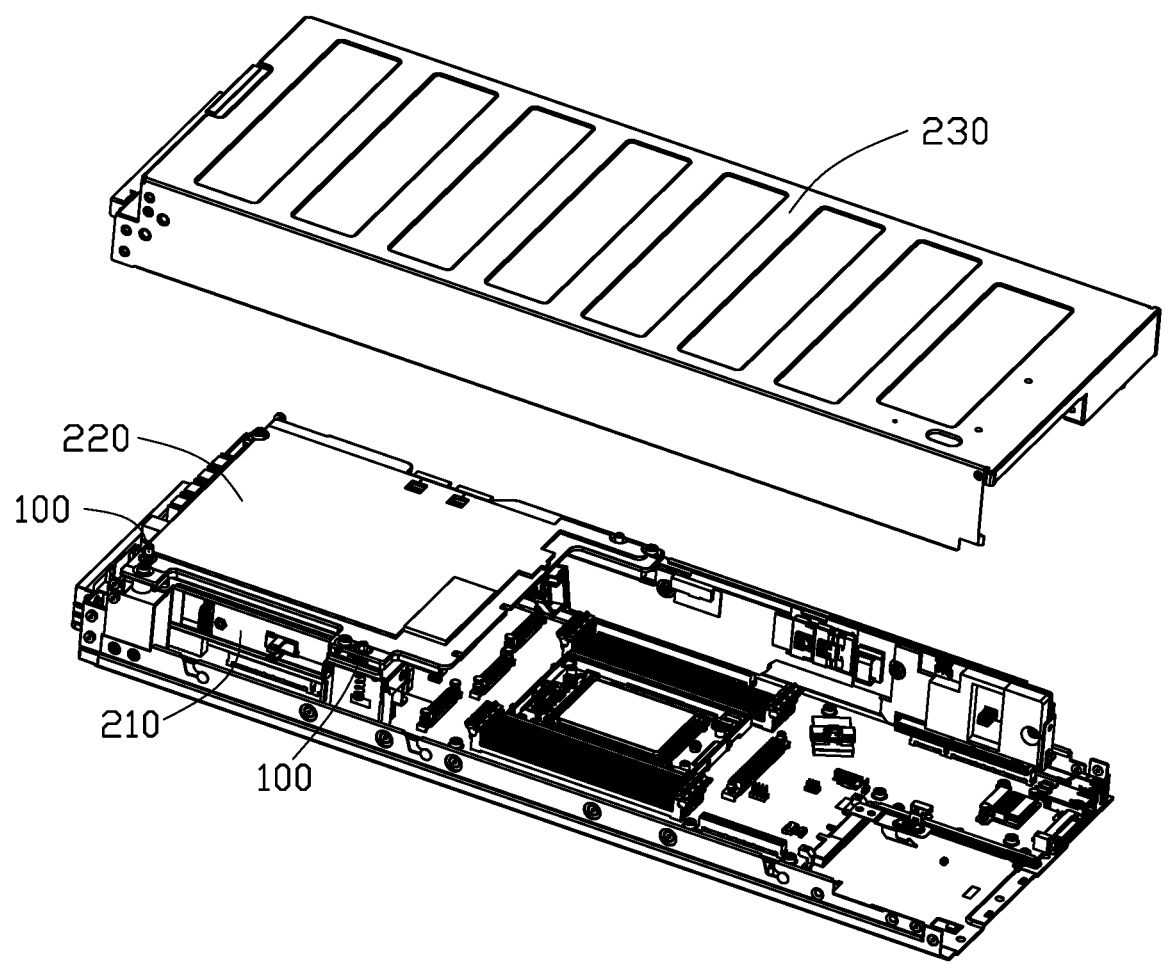
FIG. 1 is a diagrammatic view of an embodiment of a mainboard connection structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
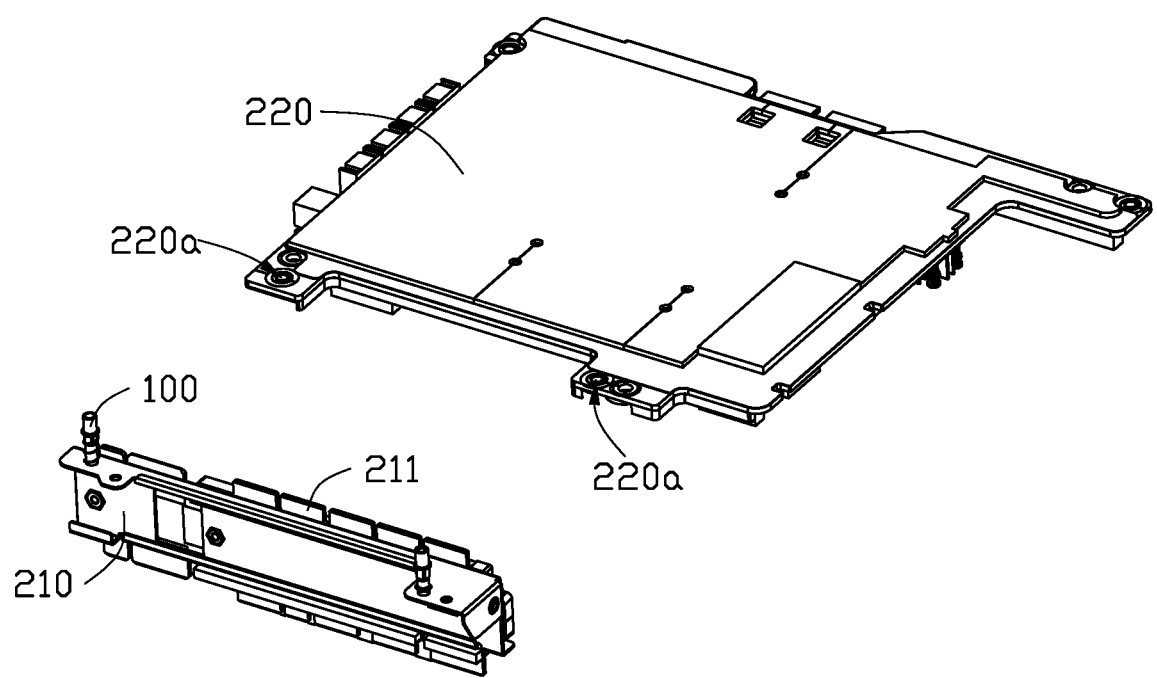
FIG. 2 is a diagrammatic view of a first mainboard and a second mainboard of the mainboard connection structure of FIG. 1.
Figure 3:
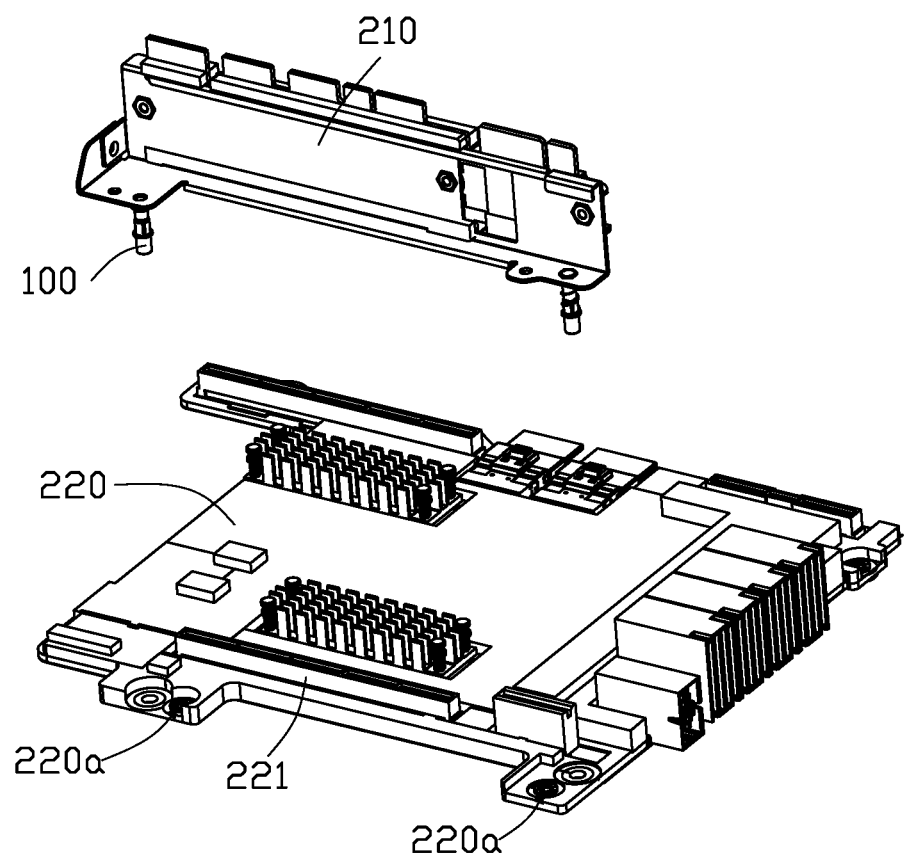
FIG. 3 is a diagrammatic view of the first mainboard and the second mainboard of FIG. 2 viewed from another angle.

FIG. 1 illustrate an embodiment of a mainboard connection structure 200. Referring to FIGS. 1, 2 and 3, The mainboard connection structure 200 includes a first mainboard 210, a second mainboard 220, and a plurality of guiding devices 100. The plurality of guiding devices 100 are arranged on the first mainboard 210. A plurality of guiding holes 220a are defined in the second mainboard 220. When the first mainboard 210 and the second mainboard 220 are inserted into each other, each guiding device 100 is inserted into one of the plurality of guiding holes 220a to guide, so that the first mainboard 210 and the second mainboard 220 are inserted into each other accurately to avoid blind insertion. As a demonstration example, the first mainboard 210 and the second mainboard 220 both are PCA circuit board, a connection portion 211 of the first mainboard 210 is inserted into a slot of the second mainboard 220.

Referring to FIGS. 4, 5, 6, 7, and 8, the guiding device 100 includes a first telescopic member 10, a second telescopic member 20 and an elastic member 30. The first telescopic member 10 is coaxially sleeved on the second telescopic member 20 and can move coaxially relative to the second telescopic member 20. The second telescopic member 20 and the first telescopic member 10 are mutually guided. An end portion of the elastic member 30 is connected to and elastically abuts against the first telescopic member 10. When inserting the first mainboard 210 and the second mainboard 220, the first telescopic member 10 needs to be inserted into the guide holes 220a. At the beginning of the insertion process of the first mainboard 210 and the second mainboard 220, the first telescopic member 10 and the second telescopic member 20 do not move relative to each other. When the first telescopic member 10 is inserted into the guide holes 220a for a certain distance, the first telescopic member 10 will be restricted by an external force and stop moving. At this time, the second telescopic member 20 will slide in a sliding cavity 11a under an action of an insertion force (that is, the first telescopic member 10 is retracted relative to the second telescopic member 20), and the elastic member 30 will be squeezed at the same time. When the external force disappears (for example, after disassembling the first mainboard 210 and the second mainboard 220), the elastic member 30 release an elastic force so that the first telescopic member 10 can be extended to reset, so as to achieve a purpose that the guide device 100 can adjust its own length to improve adaptability. The first telescopic member 10 is restricted by the external force because a housing 230 blocks the movement of the first telescopic member 10. That is, a distance between the housing 230 and the guide holes 220a is the maximum moving distance of the first telescopic member 10. In at least one embodiment, the movement of the first telescopic member 10 may be limited by other structures.

In at least one embodiment, the first telescopic member 10 includes a main body 11. The main body 11 is used to be inserted into the guide hole 220a. the main body 11 includes a sliding cavity 11a. The sliding cavity 11a penetrates opposite ends of the main body 11 along an axis of the main body 11. The second telescopic member 20 includes a connecting portion 21 and a guiding portion 22. One end of the connecting portion 21 is fixed on the first mainboard 210, the other end of the connecting portion 21 is connected to the guiding portion 22. The guiding portion 22 extends in a direction away from the connecting portion 21 and is slidably inserted into the sliding cavity 11a along the axis of the main body 11. As an exemplary example, the main body 11 may be a cylindrical sleeve structure, the sliding cavity 11a is a hollow portion of the main body 11. The connecting portion 21 and the guiding portion 22 are both cylindrical structures. A diameter of the guiding portion 22 is the same as an inner diameter of the main body 1, so that an outer wall of the guiding portion 22 can contact an inner wall of the main body 11. As a result, the guiding portion 22 can guide the movement of the main body 11.

In at least one embodiment, the elastic member 30 may be a compression spring and is sleeved on the second telescopic member 20. Opposite ends of the elastic member 30 are respectively connected to the connecting portion 21 (or the first mainboard 210) and the main body 11, and can always push the main body 11 in a direction away from the connecting portion 21. It is worth noting that when the elastic member 30 is not affected by external forces (expect the gravity of the first telescopic member 10), the farthest distance between an end of the main body 11 and an end of the connecting portion 21 is greater than a total length of the second telescopic member 20, that is, the top end of the main body 11 is higher than the top end of the guide portion 22, so that the main body 11 protrudes from the guiding portion 22 by a certain distance so as to be able to be inserted into the guiding hole 220a.

In at least one embodiment, the second telescopic member 20 may include an extension portion 23. The extension portion 23 is connected between the connecting portion 21 and the guiding portion 22. Along the same direction, a cross-sectional area of the extension portion 23 is less than a cross-sectional area of the connecting portion 21 and is less than a cross-sectional area of the guiding portion 22, so that the extension portion 23 is recessed inwardly compared with the connecting portion 21 and the guiding portion 22 to form a concave 20a around the extension portion 23. An end of the main body 11 close to the connecting portion 21 is provided with a stopper portion 11b. The stopper portion 11b is located in the concave 20a and is limited between the connecting portion 21 and the guiding portion 22 to prevent the main body 11 from disengaging from the guiding portion 22 when the elastic force of the elastic member 30 is too large, and prevent the main body 11 from crushing the first mainboard 210 when the external force is too large.

Figure 6:
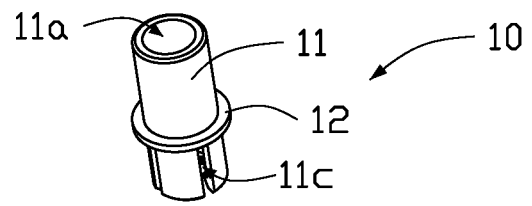
FIG. 6 is an exploded, diagrammatic view of the guiding device of FIG. 4.
Figure 6:
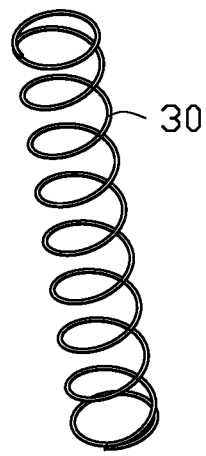
Figure 6:
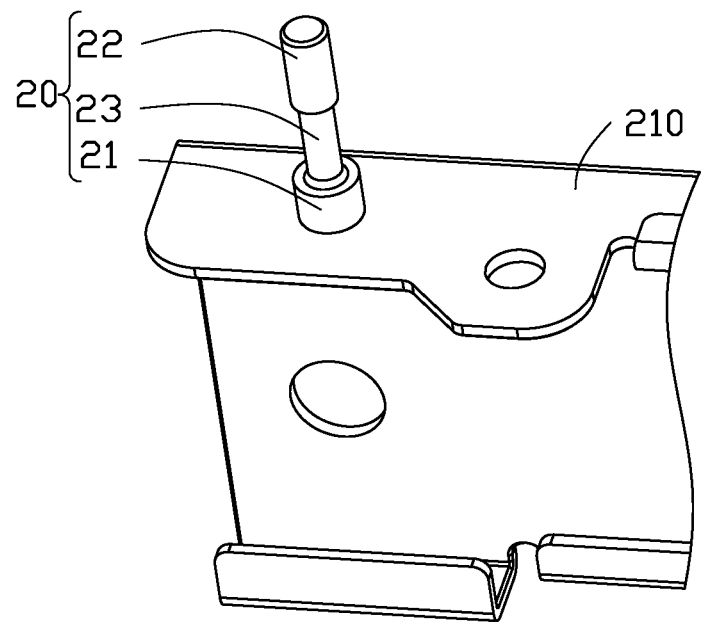
Figure 7:
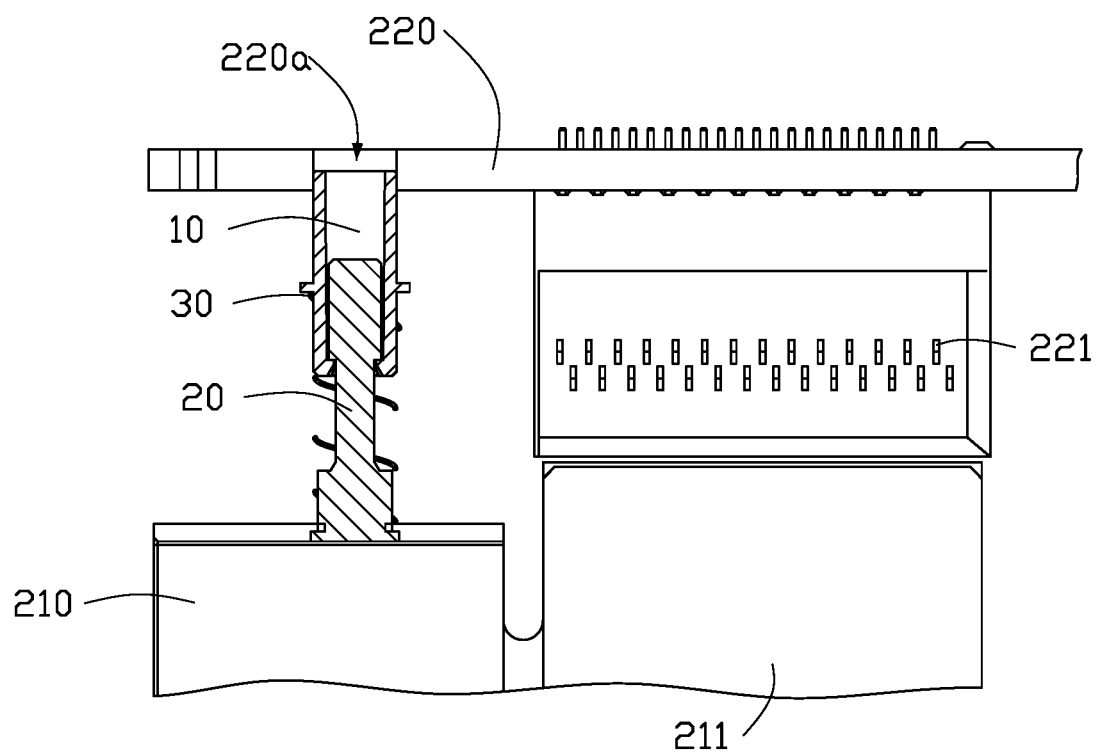
FIG. 7 is a schematic diagram of an embodiment of a first mainboard and a second mainboard before connection.
Figure 8:
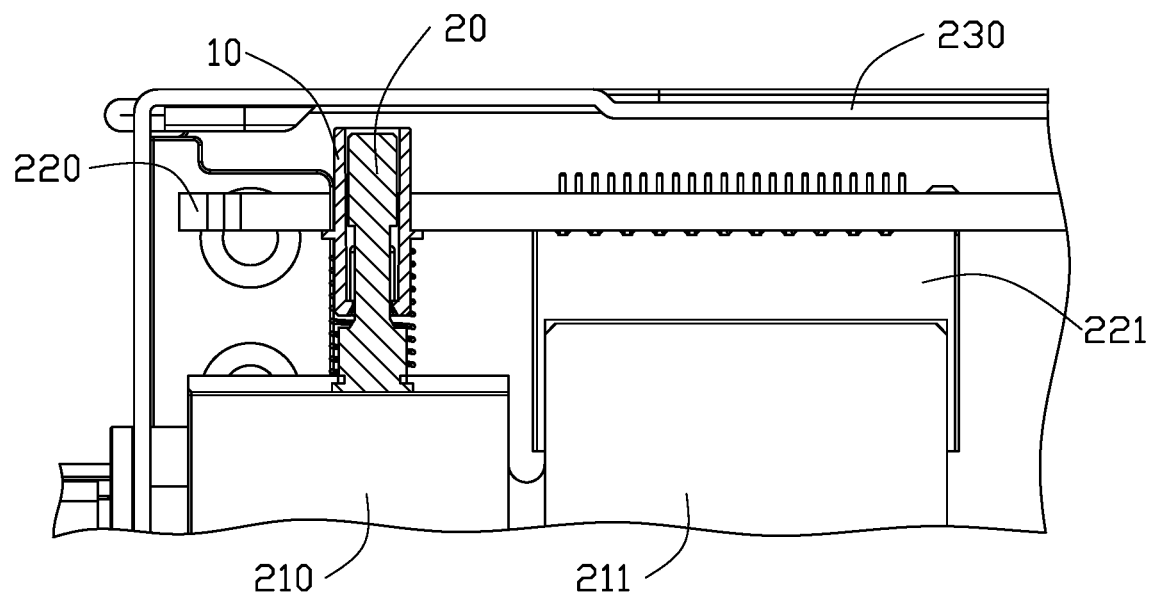
FIG. 8 is a schematic diagram the first mainboard and the second mainboard of FIG. 7 after connection.

Referring to FIG. 6, in at least one embodiment, at least two parting grooves 11c are defined on the main body 11. Each parting groove 11c extends from the middle of the main body 11 to penetrate through the end of the main body 11 close to the connecting portion 21, and each parting groove 11c penetrates the inner wall of the main body 11 and an outer wall of the main body 11. A plurality of parting grooves 11c are evenly distributed around the axis of the main body 11. The parting grooves 11c divide a portion of the main body 11 close to the connecting portion 21 into multiple parts, so that the main body 11 may be directly installed on the guiding portion 22 by pressing (ie, the stopper portion 11b may be installed in the concave 20a). In at least one embodiment, the main body 11 may be made of plastic and has an elasticity.

Figure 4:
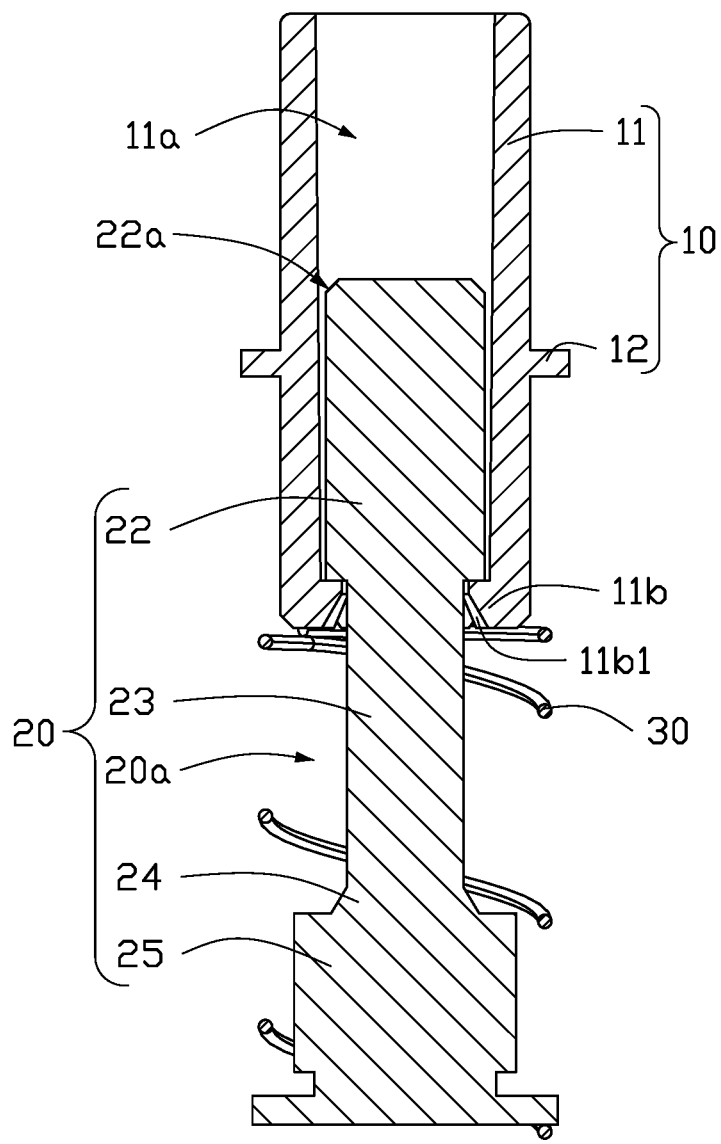
FIG. 4 is a cross-sectional view of an embodiment of a guiding device.
Figure 5:
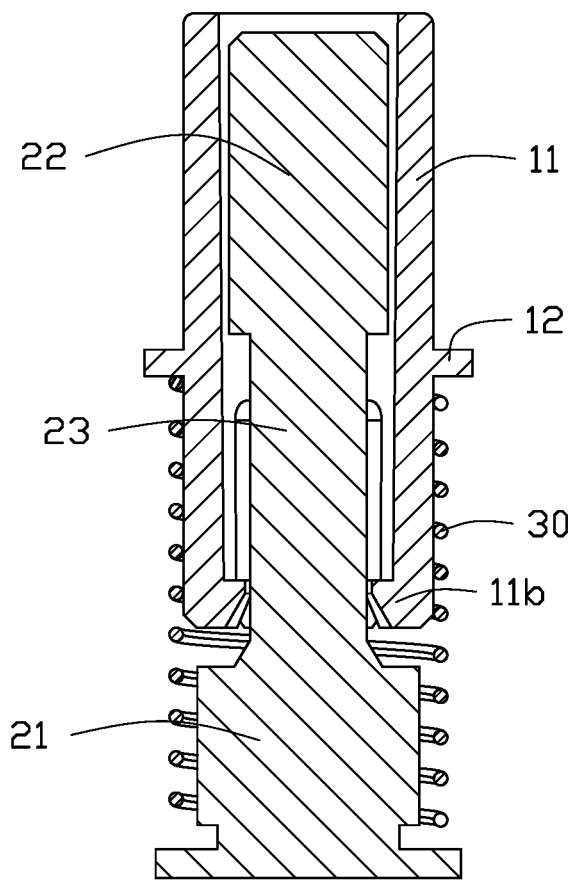
FIG. 5 is a cross-sectional view of the guiding device of FIG. 4 when the guiding device be compressed.

Referring to FIG. 4, in at least one embodiment, a side of the stopper portion 11b facing the connecting portion 21 has a first chamfer 11b1. The first chamfer 11b1 has a guiding function, which is convenient for pressing the guiding portion 22 into the main body 11.

In at least one embodiment, an edge of an end of the guiding portion 22 facing away from the connecting portion 21 has a second chamfer 22a. The second chamfer 22a has a guiding function, which is convenient for pressing the guiding portion 22 into the main body 11.

In at least one embodiment, a limiting portion 12 is formed on the outer wall of the main body 11. The limiting portion 12 may be located approximately in the middle of the main body 11 and protrudes from the outer wall of the main body 11. The end portion of the elastic member 30 abuts against the limiting portion 12. The limiting portion 12 surrounds the axis of the main body 11, and an outer diameter of the limiting portion 12 is greater than a diameter of the guiding hole 220a, so that the limiting portion 12 cannot pass through the guiding hole 220a. When the limiting portion 12 contacts the second mainboard 220, the first telescopic member 10 is restricted and cannot move. That is, a distance between the limiting portion 12 and an end portion of the main body 11 facing away from the connecting portion 21 is the maximum moving distance of the first telescopic member 10. The distance between the limiting portion 12 and the end portion of the main body 11 facing away from the connecting portion 21 may be varied as needed. For example, in order that the first telescopic member 10 does not directly contact the housing 230, the distance between the limiting portion 12 and the end portion of the main body 11 facing away from the connecting portion 21 is less than a distance between the housing 230 and the guiding hole 220a.

In at least one embodiment, the extension portion 23 may be connected to the connecting portion 21 by a reinforcing portion 24. Along a same direction, a width of the reinforcing portion 24 gradually increases from the extension portion 23 to the connecting portion 21 to improve the connection stability between the extension portion 23 and the connecting portion 21 and prevent the extension portion 23 from breaking.

In at least one embodiment, along a direction of the axis of the main body 11, a length of the sliding cavity 11a may be greater than or equal to 1.5 times a length of the guiding portion 22, so that the first telescopic member 10 has a sufficient effective telescopic distance relative to the second telescopic member 20, at the same time, a structural strength between the first telescopic member 10 and the second telescopic member 20 can be improved, and so as to avoid that the guiding portion 22 cannot be guided because the first telescopic member 10 is too short.

In at least one embodiment, a length of the extension portion 23 may be less than a length of the main body 11, so that the main body 11 will not completely separate from the guiding portion 22 under the action of the external force, resulting in structural failure. Preferably, a total length of the extension portion 23 and the guiding portion 22 may be equal to the length of the main body 11.

In the above-mentioned guiding device 100, the first telescopic member 10 can move coaxially relative to the second telescopic member 20 under the external force, and the elastic member 30 can reset the first telescopic member 10, so that the guiding device 100 can expand and contract to adjust the length, thereby improving adaptability. The mainboard connection structure 200 is matched with the corresponding guiding holes 220a through the guiding device 100, the first mainboard 210 is accurately inserted into the second mainboard 220, thereby improving an insertion efficiency.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A guiding device comprising:
 a first telescopic member comprising a main body, wherein the main body comprises a sliding cavity penetrating opposite ends of the main body along an axis of the main body;
 a second telescopic member comprising a connecting portion and a guiding portion, wherein one end of the connecting portion is fixed, the other end of the connecting portion is connected to the guiding portion, the guiding portion extends in a direction away from the connecting portion and is slidably inserted into the sliding cavity along the axis of the main body; and
 an elastic member, wherein opposite ends of the elastic member are respectively connected to the connecting portion and the main body, and the elastic member pushes the main body in a direction away from the connecting portion;
 wherein the farthest distance between an end of the main body and an end of the connecting portion is greater than a total length of the second telescopic member, the guiding portion guide the main body through the sliding cavity.

2. The guiding device of claim 1, wherein the second telescopic member further comprises an extension portion, the extension portion is connected between the connecting portion and the guiding portion, along a same direction, a cross-sectional area of the extension portion is less than a cross-sectional area of the connecting portion and is less than a cross-sectional area of the guiding portion, the extension portion is recessed inwardly compared with the connecting portion and the guiding portion to form a concave around the extension portion, an end of the main body close to the connecting portion is provided with a stopper portion, the stopper portion is located in the concave.

3. The guiding device of claim 2, wherein at least two parting grooves are defined on the main body, each of the at least two parting grooves extends from the end of the main body close to the connecting portion in a direction away from the connecting portion, and penetrates an inner wall of the main body and an outer wall of the main body.

4. The guiding device of claim 3, wherein the at least two parting grooves are distributed at intervals around the axis of the main body.

5. The guiding device of claim 3, wherein a side of the stopper portion facing the connecting portion has a first chamfer.

6. The guiding device of claim 3, wherein an edge of an end of the guiding portion facing away from the connecting portion has a second chamfer.

7. The guiding device of claim 1, wherein a limiting portion protrudes from an outer wall of the main body, the end of the elastic member abuts against the limiting portion.

8. The guiding device of claim 2, wherein the extension portion is connected to the connecting portion by a reinforcing portion, along a same direction, a width of the reinforcing portion gradually increases from the extension portion to the connecting portion.

9. The guiding device of claim 2, wherein a length of the sliding cavity is greater than or equal to 1.5 times a length of the guiding portion.

10. The guiding device of claim 2, wherein a length of the extension portion is less than a length of the main body.

11. A mainboard connection structure comprising:
 a first mainboard;
 a second mainboard; and
 a plurality of guiding devices, each of the plurality of guiding devices comprising:
  a first telescopic member comprising a main body, wherein the main body comprises a sliding cavity penetrating opposite ends of the main body along an axis of the main body;
  a second telescopic member comprising a connecting portion and a guiding portion, wherein one end of the connecting portion is fixed, the other end of the connecting portion is connected to the guiding portion, the guiding portion extends in a direction away from the connecting portion and is slidably inserted into the sliding cavity along the axis of the main body; and
  an elastic member, wherein opposite ends of the elastic member are respectively connected to the connecting portion and the main body, and the elastic member pushes the main body in a direction away from the connecting portion;
 wherein the farthest distance between an end of the main body and an end of the connecting portion is greater than a total length of the second telescopic member, the guiding portion guide the main body through the sliding cavity; the plurality of guiding devices are arranged on the first mainboard, a plurality of guiding holes are defined in the second mainboard, the main body of each of the plurality of guiding devices is inserted into one of the plurality of guiding holes.

12. The mainboard connection structure of claim 11, the second telescopic member further comprises an extension portion, the extension portion is connected between the connecting portion and the guiding portion, along a same direction, a cross-sectional area of the extension portion is less than a cross-sectional area of the connecting portion and is less than a cross-sectional area of the guiding portion, the extension portion is recessed inwardly compared with the connecting portion and the guiding portion to form a concave around the extension portion, an end of the main body close to the connecting portion is provided with a stopper portion, the stopper portion is located in the concave.

13. The mainboard connection structure of claim 12, wherein at least two parting grooves are defined on the main body, each of the at least two parting grooves extends from the end of the main body close to the connecting portion in a direction away from the connecting portion, and penetrates an inner wall of the main body and an outer wall of the main body.

14. The mainboard connection structure of claim 13, wherein the at least two parting grooves are distributed at intervals around the axis of the main body.

15. The mainboard connection structure of claim 13, wherein a side of the stopper portion facing the connecting portion has a first chamfer.

16. The mainboard connection structure of claim 13, wherein an edge of an end of the guiding portion facing away from the connecting portion has a second chamfer.

17. The mainboard connection structure of claim 11, wherein a limiting portion protrudes from an outer wall of the main body, the end of the elastic member abuts against the limiting portion.

18. The mainboard connection structure of claim 12, wherein the extension portion is connected to the connecting portion by a reinforcing portion, along a same direction, a width of the reinforcing portion gradually increases from the extension portion to the connecting portion.

19. The mainboard connection structure of claim 12, wherein a length of the sliding cavity is greater than or equal to 1.5 times a length of the guiding portion.

20. The mainboard connection structure of claim 12, wherein a length of the extension portion is less than a length of the main body.

* * * * *